United States Patent
Shieh et al.

(10) Patent No.: US 12,052,841 B2
(45) Date of Patent: Jul. 30, 2024

(54) SERVER AND SERVER SYSTEM INCLUDING TWO SERVER UNITS PIVOTED TO EACH OTHER

(71) Applicants: LITE-ON ELECTRONICS (GUANGZHOU) LIMITED, Guangzhou (CN); Lite-On Technology Corporation, Taipei (TW)

(72) Inventors: Wei-Ming Shieh, Taipei (TW); Yi-Feng Pu, Taipei (TW); Chien-Wen Yeh, Taipei (TW); Hung-Hsing Chiu, Taipei (TW); Pei-Hsuan Huang, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 384 days.

(21) Appl. No.: 17/080,857

(22) Filed: Oct. 27, 2020

(65) Prior Publication Data
US 2021/0204438 A1 Jul. 1, 2021

(30) Foreign Application Priority Data
Dec. 30, 2019 (CN) .......................... 201922439724.7

(51) Int. Cl.
*H05K 7/14* (2006.01)
*H05K 7/16* (2006.01)
(52) U.S. Cl.
CPC .............. *H05K 7/1489* (2013.01); *H05K 7/16* (2013.01)

(58) Field of Classification Search
None
See application file for complete search history.

(56) References Cited

U.S. PATENT DOCUMENTS

| | | | |
|---|---|---|---|
| 2008/0068788 A1* | 3/2008 | Ozawa | H04Q 1/035 361/679.45 |
| 2013/0242501 A1* | 9/2013 | Chen | G06F 1/183 361/752 |
| 2014/0307386 A1* | 10/2014 | French, Jr. | H05K 7/1487 361/679.58 |
| 2015/0366095 A1* | 12/2015 | Junkins | G06F 1/181 312/319.2 |
| 2016/0135322 A1* | 5/2016 | Chen | H05K 7/20727 361/679.46 |

FOREIGN PATENT DOCUMENTS

CN 114442758 A * 5/2022

* cited by examiner

*Primary Examiner* — James Wu
*Assistant Examiner* — Christopher L Augustin
(74) *Attorney, Agent, or Firm* — JCIPRNET (57) ABSTRACT

A server includes a first server unit, a second server unit, a hinge and a connecting element. The second server unit is disposed on the first server unit and is electrically connected to the first server unit. The second server unit is pivoted to the first server unit through the hinge. The connecting element is disposed between the first server unit and the second server unit. The connecting element has a first connection end and a second connection end, wherein the first connection end is connected to the first server unit, and the second connection end is connected to the second server unit. A server system including a rack and at least one server is also provided.

21 Claims, 10 Drawing Sheets

SERVER AND SERVER SYSTEM INCLUDING TWO SERVER UNITS PIVOTED TO EACH OTHER

CROSS REFERENCE TO RELATED APPLICATION

This application claims the priority benefit of China application serial no. 201922439724.7, filed on Dec. 30, 2019. The entirety of the above-mentioned patent application is hereby incorporated by reference herein and made a part of specification.

BACKGROUND

Technical Field

The disclosure relates to a server, and more particular to a server and a server system.

Description of Related Art

With technological advancements and changes to the work and lifestyle of modern people, large amount of information and data are transmitted, exchanged, calculated and stored every day. Due to the constant growth of demand for transmission and computing of big data, there is a need to construct a server data center without delay. In view of the difficulties in obtaining suitable land and factory building, how to build a high density and high efficiency server within a limited space has become an issue that the relevant manufacturers are eager to overcome.

Taking a rack server that adopts a drawer design as an example, a slide rail mechanism should be disposed in a casing, therefore occupying the interior space of the casing, causing the functional density of the rack server to decrease.

SUMMARY

This disclosure provides a server and a server system, of which functional density is high, and has excellent scalability and operational reliability.

The disclosure provides a server which includes a first server unit, a second server unit, a hinge and a connecting element. The second server unit is disposed on the first server unit, wherein the second server unit is electrically connected to the first server unit, and the second sever unit is pivoted to the first server unit through the hinge. The connecting element is disposed between the first server unit and the second server unit. The connecting element has a first connection end and a second connection end, wherein the first connection end is connected to the first server unit, and the second connection end is connected to the second server unit.

The disclosure provides a server system, which includes a rack and at least one server. The rack has a storage space and the server is located in the storage space. The server includes a first server unit, a second server unit, a hinge, a connecting element and a slide rail. The second server unit is disposed on the first server unit and is electrically connected to the first server unit. The second server unit is pivoted to the first server unit through the hinge. The connecting element is disposed between the first server unit and the second server unit. The connecting element has a first connection end and a second connection end, wherein the first connection end is connected to the first server unit, and the second connection end is connected to the second server unit. The slide rail is disposed on the first server unit and is connected to the rack.

In an embodiment of the disclosure, the first server unit and the second server unit both have a pivoting end and a detachable end, and the pivoting end of the second server unit is pivoted to the pivoting end of the first server unit through the hinge. The first connection end of the connecting element is located between the pivoting end and the detachable end of the first server unit, and the second connection end of the connecting element is located between the pivoting end and the detachable end of the second server unit.

In an embodiment of the disclosure, a distance between the first connection end of the connecting element and the hinge is greater than or equal to a distance between the first connection end of the connecting element and the detachable end of the first server unit.

In an embodiment of the disclosure, the server further includes a first fastener and a second fastener. The first fastener is disposed at the detachable end of the first server unit. The second fastener is disposed at the detachable end of the second server unit as corresponding to the first fastener.

In an embodiment of the disclosure, the first server unit has a receding space, and the second server unit has a base facing the receding space. The first connection end of the connecting element is located in the receding space, and the second connection end of the connecting element is connected to the base. The receding space is configured to accommodate the connecting element.

In an embodiment of the disclosure, at least one of the first server unit and the second server unit has a receding space, and the receding space is configured to accommodate the connecting element.

In an embodiment of the disclosure, the connecting element includes a first rod and a second rod that is movably connected to the first rod. The first connection end is located on the first rod, and the second connection end is located on the second rod.

In an embodiment of the disclosure, at least one of the first server unit and the second server unit has a receding space. The first connection end of the connecting element connects to an inner sidewall of the first server unit, and the second connection end of the connecting element connects to an inner sidewall of the second server unit. The receding space is configured to accommodate the connecting element.

In an embodiment of the disclosure, the slide rail is disposed on an outer sidewall of the first server unit.

Based on the above, a server system of the disclosure includes a server, and two server units of the server adopt a swivel design for unfolding and folding, thereby preventing the interior space of each server unit from being occupied, and increasing the functional density. After the first server unit and the second server unit are unfolded, the connecting element can stably support the second server unit to prevent the second server unit from dropping. Therefore, the server and the server system of the disclosure not only have excellent scalability and operational reliability, but are also quite convenient for an operator to perform maintenance.

To make the abovementioned features and advantages of the disclosure more comprehensible, exemplary embodiments in concert with diagrams are described in detail below.

DESCRIPTION OF THE EMBODIMENTS

Figure 1A:
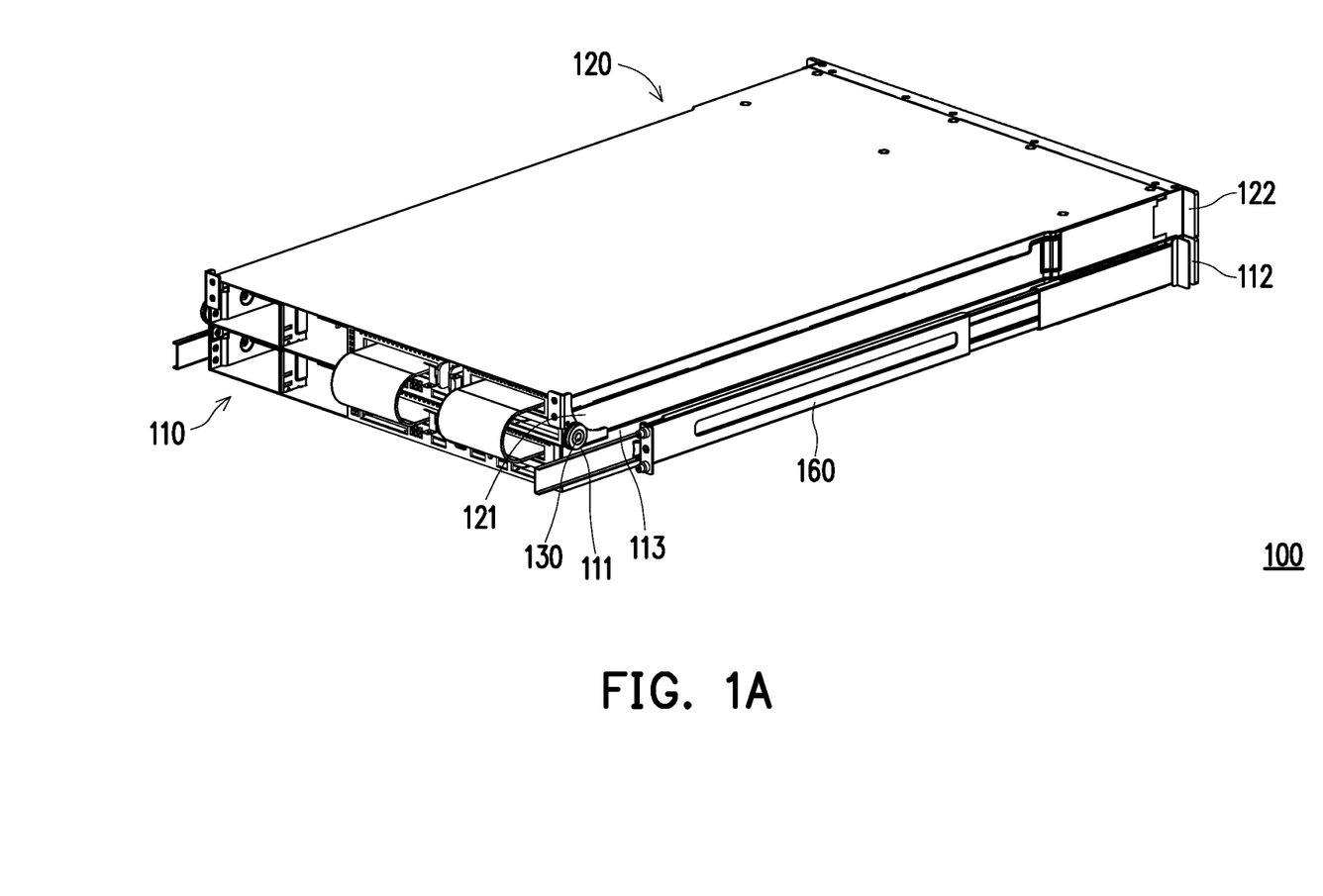
FIG. 1A and FIG. 1B are schematic diagrams of a server in two different states according to an embodiment of the disclosure.
Figure 1B:
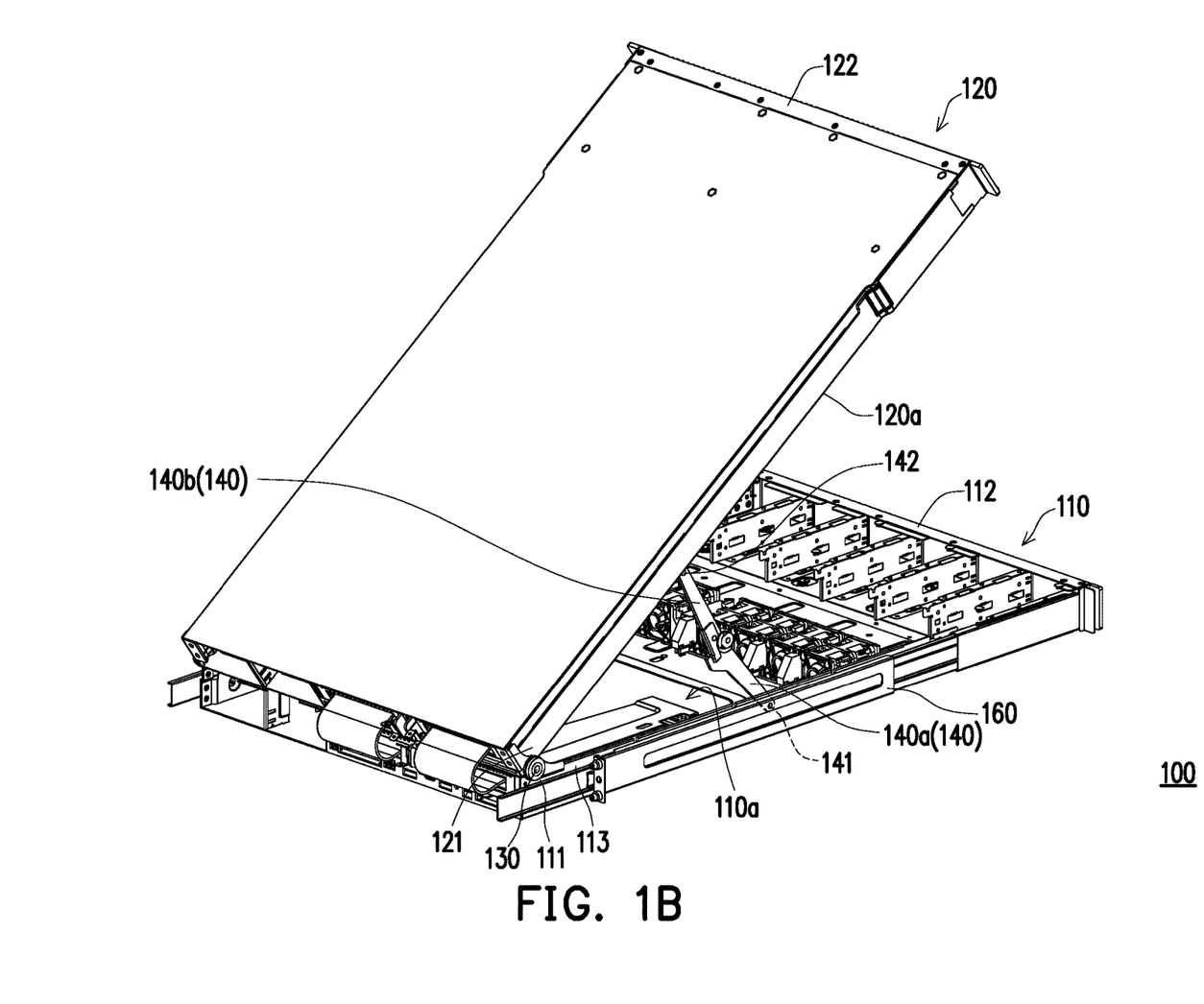
Figure 2A:
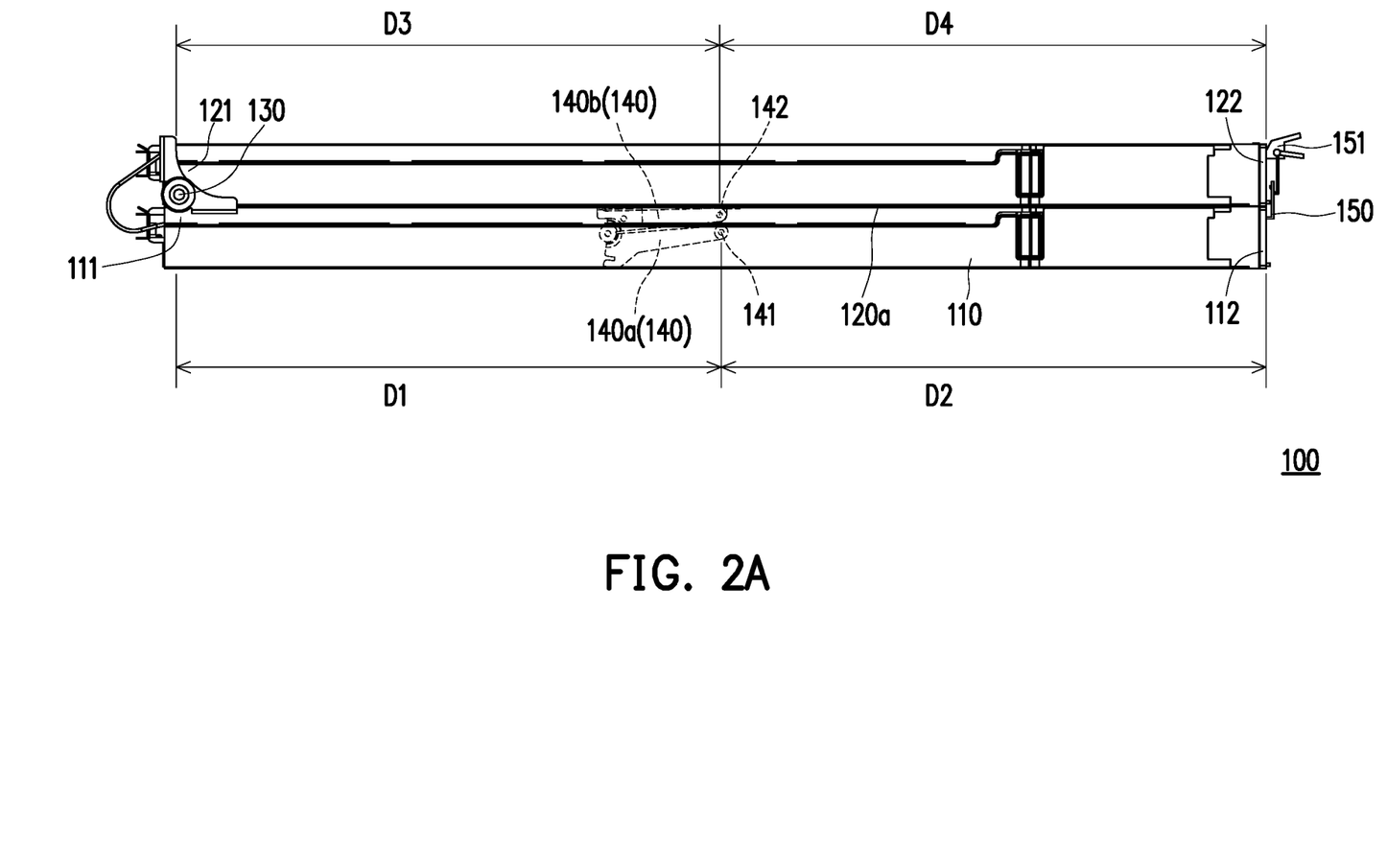
FIG. 2A is a schematic side view of the server in FIG. 1A.
Figure 2B:
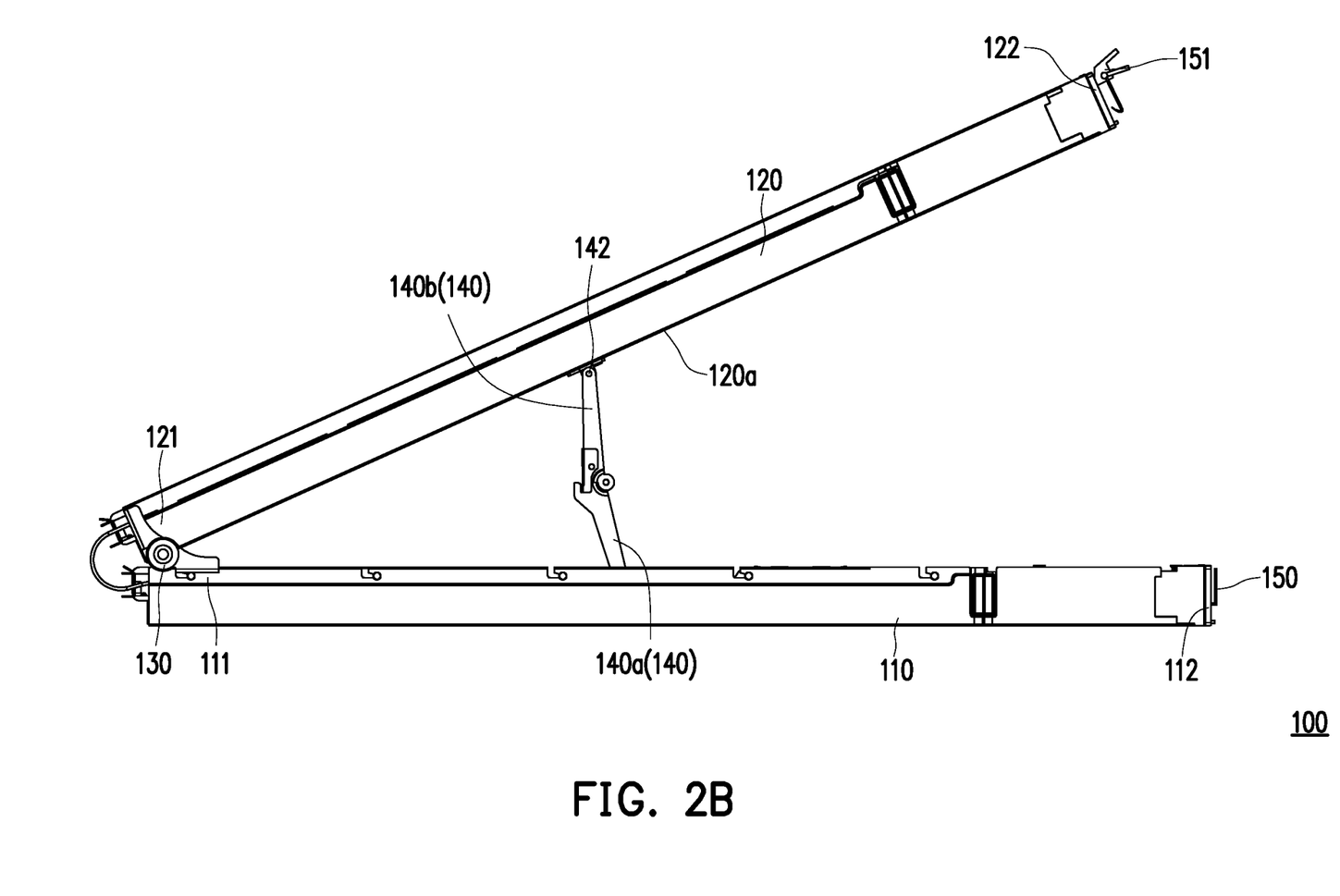
FIG. 2B is a schematic side view of the server in FIG. 1B.

FIG. 1A and FIG. 1B are schematic diagrams of a server in two different states according to an embodiment of the disclosure. FIG. 2A is a schematic side view of the server in FIG. 1A. FIG. 2B is a schematic side view of the server in FIG. 1B. It should note that a slide rail 160 is omitted in FIG. 2A and FIG. 2B. With reference to FIG. 1A and FIG. 1B, in this embodiment, a server 100 adopts a swivel design for unfolding and folding, and includes a first server unit 110, a second server unit 120, a hinge 130, and a connecting element 140. In the state shown in FIG. 1A, the second server unit 120 is covered and stacked on the first server unit 110. In the state shown in FIG. 1B, the second server unit 120 is opened and lifted relative to the first server unit 110.

The first server unit 110 and the second server unit 120 each include a casing and required components disposed in the casing, and the first server unit 110 is electrically connected to the second server unit 120. In one aspect of the embodiment, functions of a control parts and an arithmetic logic parts of the first server unit 110 and the second server unit 120 may be performed through the same processor, and the processor is disposed either in the first server unit 110 or the second server unit 120. In another aspect of the embodiment, the functions of the control parts and the arithmetic logic parts of the first server unit 110 and the second server unit 120 may be performed by two processors respectively, and one of the processors is disposed in the first server unit 110, while the other is disposed in the second server unit 120.

For example, the components in the first server unit 110 may include a motherboard, a processor, a memory, a hard disk, or a combination thereof, and the components in the second server unit 120 may be selectively collocated according to requirements of the application environment. If the second server unit 120 is linked to the first server unit 110, the second server unit 120 may be either used as a storage server unit, which includes a hard disk and other required components, or may be used as a computing server unit, which includes a processor, an accelerator, a memory, an signal packet switch and a bridge, etc., or may be used as a multi-functional server unit, which includes a hard disk, a processor, an accelerator, a memory, a signal packet switch, a bridge and so on. If the second server unit 120 is not linked to the first server unit 110, then the components in the second server unit 120 may be similar to a configuration of the first server unit 110, and other required components may be taken into consideration for functional collocation.

In particular, the above-mentioned processor may be a central processing unit (CPU), a graphics processor (GPU), a field programmable logic gate array (FPGA), or a special application integrated circuit (ASIC).

The second server unit 120 is disposed on the first server unit 110, and the hinge 130 and the connecting element 140 are used to connect the second server unit 120 and the first server unit 110, so as to increase stability of the first server unit 110 and the second server unit 120 during opening or closing the second server unit 120. The second server unit 120 is pivoted to the first server unit 110 through the hinge 130, and thus swiveled around a specific axis (i.e., an axis along the hinge 130) to be unfolded and folded relative to the first server unit 110. The hinge 130 may be a torque hinge to maintain the unfolded state or the folded state of the first server unit 110 and the second server unit 120, thereby preventing the first server unit 110 and the second server unit 120 from the arbitrary displacement.

As shown in FIG. 1B, FIG. 2A, and FIG. 2B, the connecting element 140 is disposed between the first server unit 110 and the second server unit 120, wherein the connecting element 140 has a first connection end 141 and a second connection end 142. The first connection end 141 is connected to the first server unit 110, and the second connection end 142 is connected to the second server unit 120. Furthermore, the first connection end 141 of the connecting element 140 is pivoted to the first server unit 110, and the second connection end 142 is pivoted to the second server unit 120.

When the second server unit 120 is swiveled and opened relative to the first server unit 110, the connecting element 140 moves along with the second server unit 120. After the connecting element 140 has completed its movement and is in the extending position, the second server unit 120 stops its rotation relative to the first server unit 110. In other words, a maximum opening angle between the second server unit 120 and the first server unit 110 is subjected to the connecting element 140. For example, the maximum opening angle between the second server unit 120 and the first server unit 110 is ranged between 15 degrees and 50 degrees.

As shown in FIG. 1B and FIG. 2B, the connecting element 140 in the extending state may stably support the second server unit 120 to prevent the second server unit 120 from dropping. Therefore, the server 100 not only has excellent operation reliability, but is also quite convenient for an operator to perform maintenance. Since the hinge 130 is disposed on the exteriors of the first server unit 110 and the second server unit 120, and the connecting element 140 has a simplified and small structure, the swivel design for unfolding and folding adopted by the server 100 can prevent the interior space of each server unit from being occupied, thereby increasing the functional density of each server unit and providing the server 100 with excellent scalability.

With reference to FIG. 1B, FIG. 2A, and FIG. 2B, in the embodiment, the first server unit 110 has a pivoting end 111 and a detachable end 112, and the second server unit 120 has a pivoting end 121 and a detachable end 122. The pivoting end 111 of the first server unit 110 is disposed corresponding to the pivoting end 121 of the second server unit 120, and the pivoting end 121 is coupled to the pivoting end 111 through the hinge 130. The detachable end 112 of the first server unit 110 is disposed corresponding to the detachable end 122 of the second server unit 120, and the detachable end 112 and the detachable end 122 may serve as points of application where the operator opens or closes the second server unit 120 relative to the first server unit 110.

More specifically, the first server unit 110 has a receding space 110a, and the second server unit 120 has a base 120a that faces the receding space 110a. The first connection end 141 of the connecting element 140 is located in the receding space 110a, and the second connection end 142 of the connecting element 140 is connected to the base 120a. When the second server unit 120 is folded on the first server unit 110, the receding space 110a is covered by the base 120a, and the entire connecting element 140 is accommodated in the receding space 110*a*. In another aspect, when the second server unit 120 is lifted relative to the first server unit 110 and opened from the first server unit 110, the base 120*a* and the receding space 110*a* are exposed to the external environment, and a part of the connecting element 140 is moved out of the receding space 110*a*.

The first connection end 141 of the connecting element 140 is located between the pivoting end 111 and the detachable end 112 of the first server unit 110, and the second connection end 142 of the connecting element 140 is located between the pivoting end 121 and the detachable end 122 of the second server unit 120. In an exemplary embodiment, a distance D1 between the first connection end 141 of the connecting element 140 and the hinge 130 (i.e., a shortest distance between the first connection end 141 and the axis passing through the hinge 130) is greater than or equal to a distance D2 between the first connection end 141 and the detachable end 112 (i.e., a shortest distance between the first connection end 141 and the detachable end 112), and a distance D3 between the second connection end 142 of the connecting element 140 and the hinge 130 (i.e., a shortest distance between the second connection end 142 and the axis passing through the hinge 130) is greater than or equal to a distance D4 between the second connection end 142 and the detachable end 122 (i.e., a shortest distance between the second connection end 142 and the detachable end 122).

In one aspect of the embodiment, a connecting junction between the connecting element 140 and the first server unit 110 may be disposed closer to the detachable end 112, and the connecting junction between the connecting element 140 and the second server unit 120 may be disposed closer to the detachable end 122, so as to reduce the opening angle between the second server unit 120 and the first server unit 110.

In other embodiments, the second server unit has a receding space. The second connection end of the connecting element is located in the receding space of the second server unit, and the first connection end of the connecting element is connected to an inner sidewall of the first server unit. When the second server unit is moved to the closed position on the first server unit, the entire connecting element is accommodated in the receding space of the second server unit.

In other embodiments, both the first server unit and the second server unit have a receding space, wherein the first connection end of the connecting element is located in the receding space of the first server unit and is connected to the inner sidewall of the first server unit. On the other hand, the second connection end of the connecting element is located in the receding space of the second server unit and is connected to an inner sidewall of the second server unit. When the second server unit is moved to the closed position on the first server unit, a part of the connecting element is accommodated in the receding space of the first server unit, and another part of the connecting element is accommodated in the receding space of the second server unit.

As illustrated in FIG. 1B, FIG. 2A, and FIG. 2B, in the embodiment, the connecting element 140 includes a first rod 140*a* and a second rod 140*b* pivotably connected to the first rod 140*a*, wherein the first connection end 141 is located on the first rod 140*a*, and the second connection end 142 is located on the second rod 140*b*. When the second server unit 120 is swiveled and opened relative to the first server unit 110, the second server unit 120 drives the second rod 140*b* to move or rotate relative to the first rod 140*a* and therefore drives the first rod 140*a* to move or rotate relative to the first server unit 110.

In addition, at a pivoting junction of the first rod 140*a* and the second rod 140*b*, the first rod 140*a* is equipped with a first position-limiting structure corresponding to the second rod 140*b*, and the second rod 140*b* is equipped with a second position-limiting structure corresponding to the first position-limiting structure. Once a mechanical interference between the first and second position-limiting structures occurs in the displacement process of the first rod 140*a* and the second rod 140*b*, the connecting element 140 completes its unfolded movement and is in the extending position, such that the second server unit 120 stops swiveling relative to the first server unit 110. For example, the first position-limiting structure may be a slot on the first rod 140*a*, and the second position-limiting structure may be a protrusion on the second rod 140*b*. Once the protrusion is engaged in the slot, the connecting element 140 completes its unfolded movement and is in the extending position, such that the second server unit 120 stops its movement relative to the first server unit 110.

With reference to FIG. 2A and FIG. 2B, in the embodiment, the server 100 further includes a first fastener 150 and a second fastener 151, wherein the first fastener 150 is disposed at the detachable end 112 of the first server unit 110, and the second fastener 151 is disposed at the detachable end 122 of the second server unit 120. When the second fastener 151 is engaged with the first fastener 150, the second server unit 120 is closed and folded on the first server unit 110, and the second server unit 120 is unable to be moved or lifted relative to the first server unit 110. Only after releasing the engagement between the second fastener 151 and the first fastener 150, would the operator be able to apply force to lift the second server unit 120.

With reference to FIG. 1A and FIG. 1B, in the embodiment, the server 100 further includes a slide rail 160, wherein the slide rail 160 may be a multi-sectional slide rail, and is disposed on an outer sidewall 113 of the first server unit 110. The slide rail 160 is configured to work in concert with a rack. If there is no need to install the server 100 to the rack, then the slide rail 160 may be removed in some embodiments.

Figure 3A:
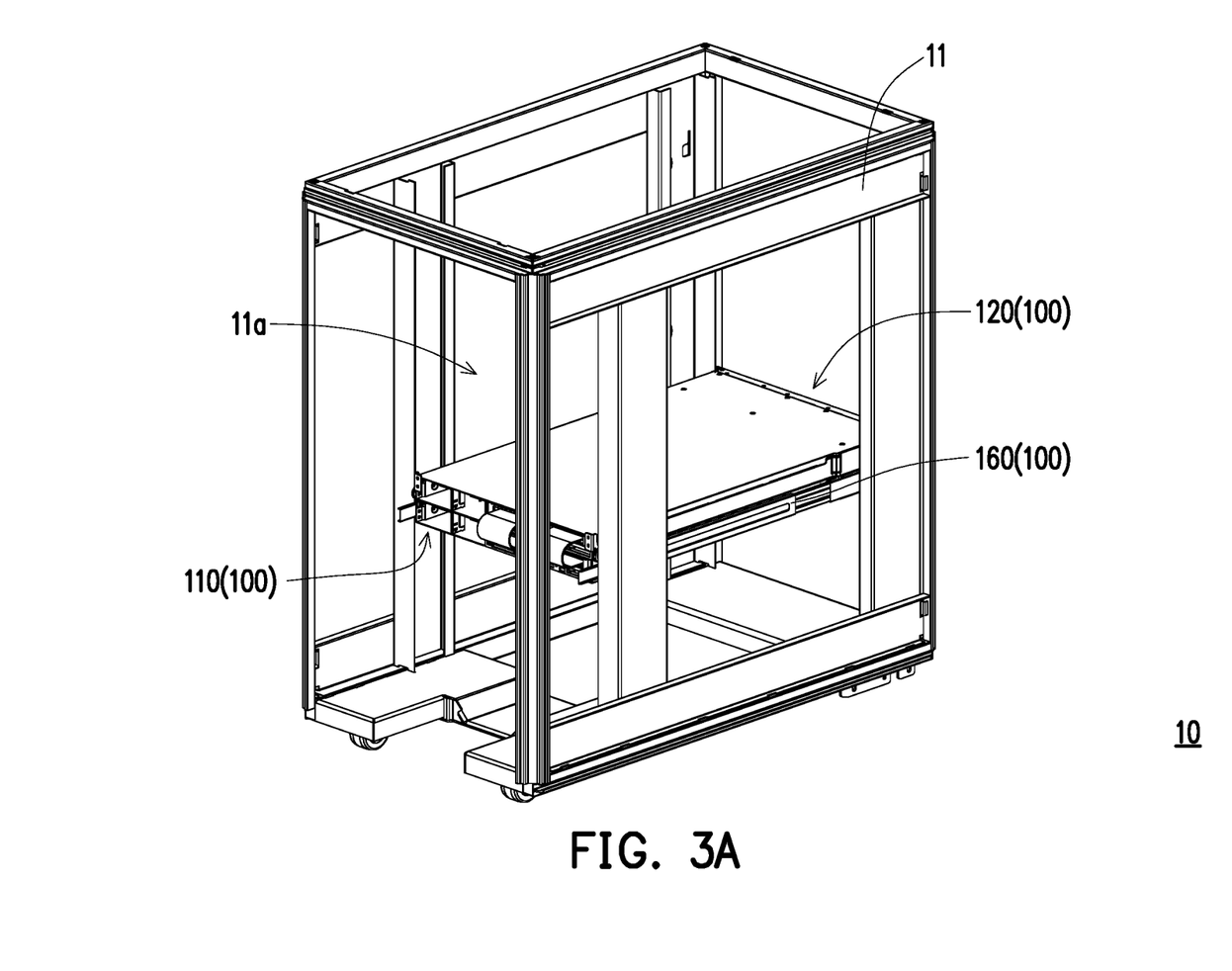
FIG. 3A to FIG. 3C are schematic diagrams of a server system in three different states according to an embodiment of the disclosure.
Figure 3B:
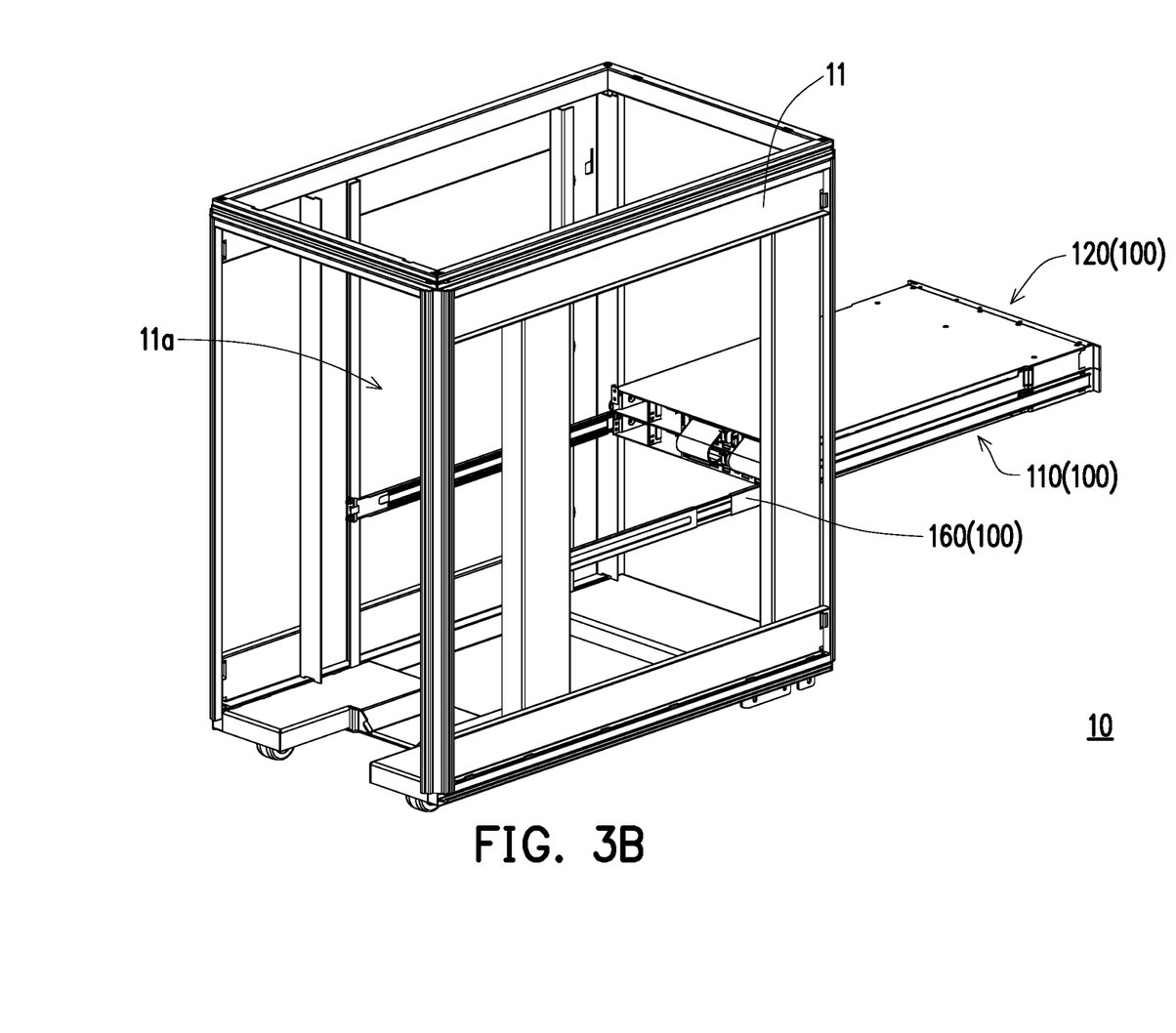
Figure 3C:
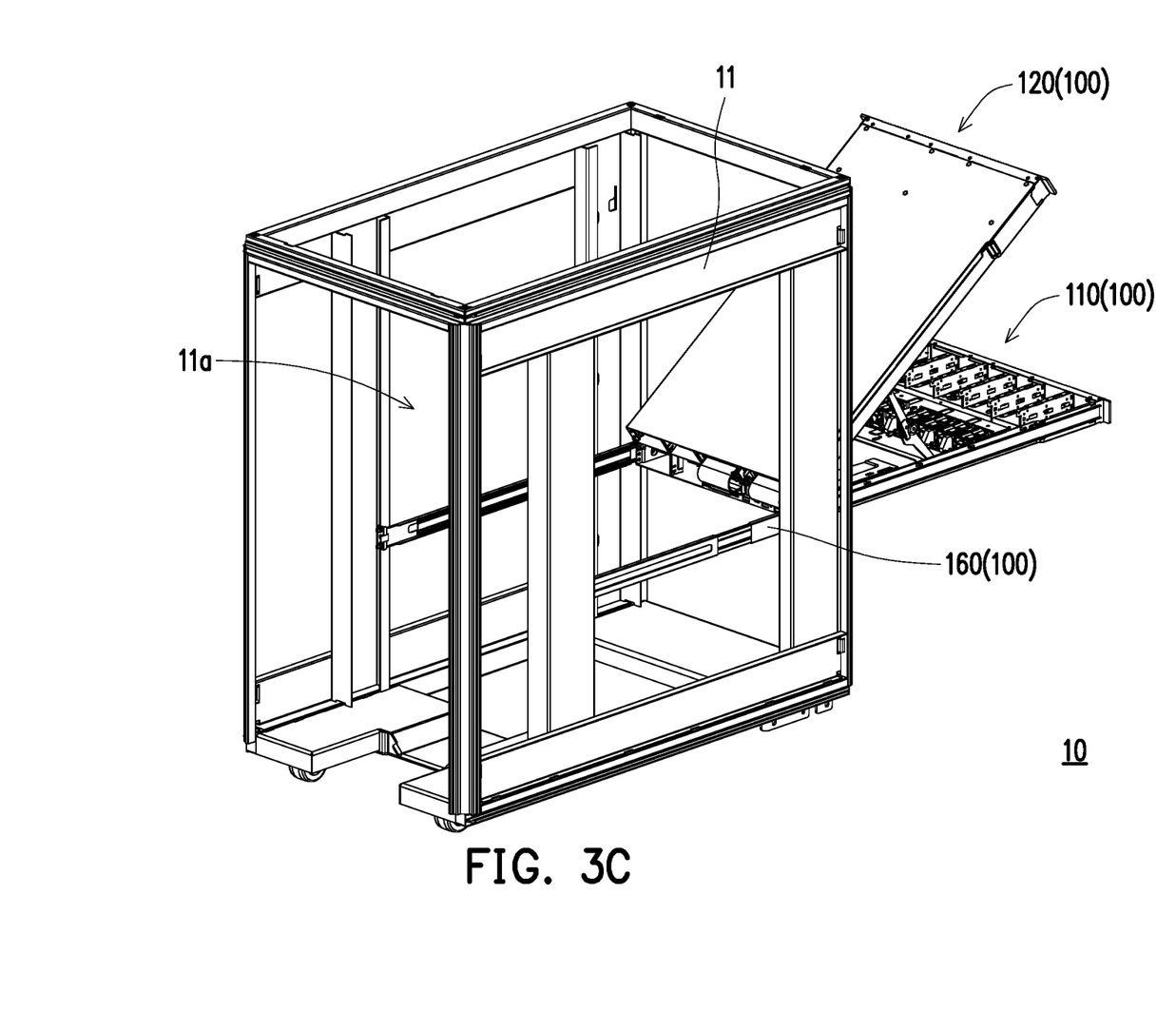

FIG. 3A to FIG. 3C are schematic diagrams of a server system in three different states according to an embodiment of the disclosure. With reference to FIG. 3A to FIG. 3C, in the embodiment, a server system 10 includes a rack 11 and at least one server 100, wherein the rack 11 has a storage space 11*a*, and the server 100 is configured to be accommodated in or moved out of the storage space 11*a*. When the server system 10 includes a plurality of servers 100, the plurality of servers 100 are disposed by stacking in the storage space 11*a*. Specifically, the operator must move the server 100 out of the storage space 11*a* before opening the second server unit 120 from the first server unit 110. On the other hand, the operator must close the second server unit 120 on the first server unit 110 before returning the server 100 into the storage space 11*a*.

The server 100 is connected to the rack 11 through the slide rail 160, and the slide rail 160 is mounted on the rack 11 by means of latching, threaded fasteners or riveting, etc. The slide rail 160 may be configured to determine a sliding path of the server 100, the server 100 may slide relative to the rack 11 through the slide rail 160 to be moved out of or returned into the storage space 11*a*.

Figure 4A:
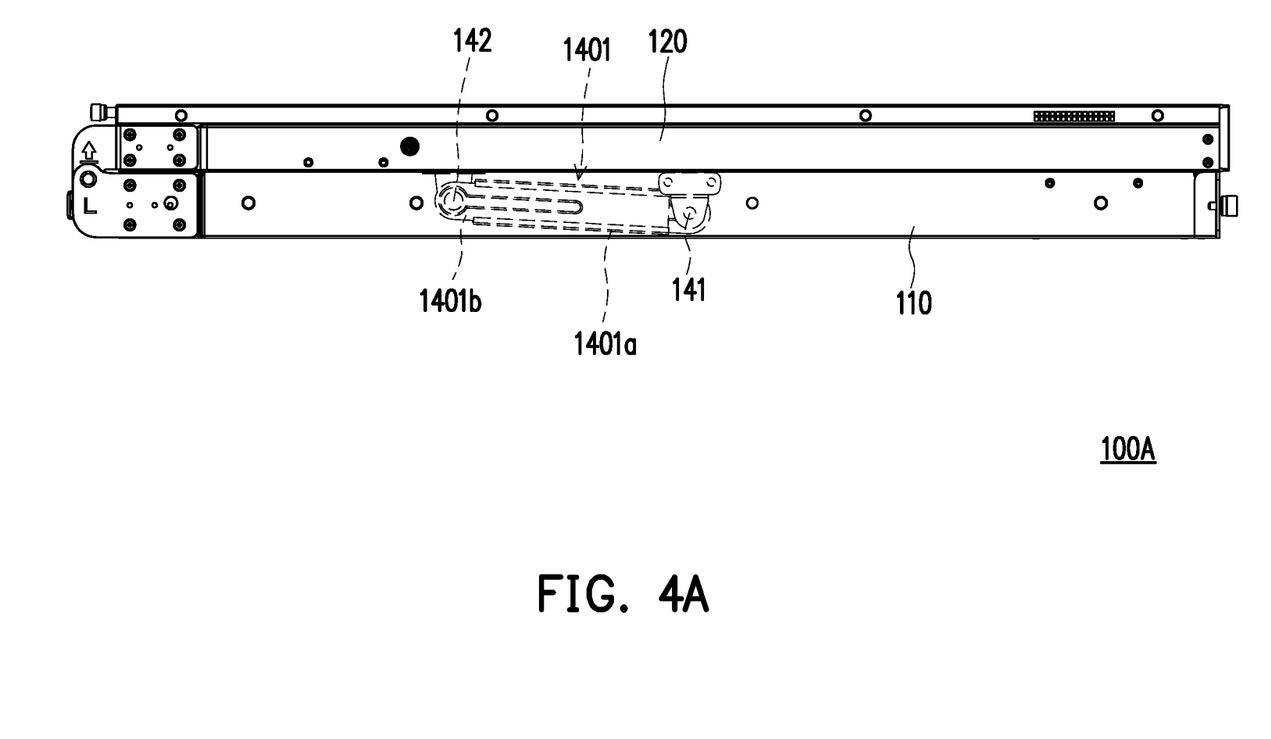
FIG. 4A and FIG. 4B are schematic diagrams of a server in two different states according to another embodiment of the disclosure.
Figure 4B:
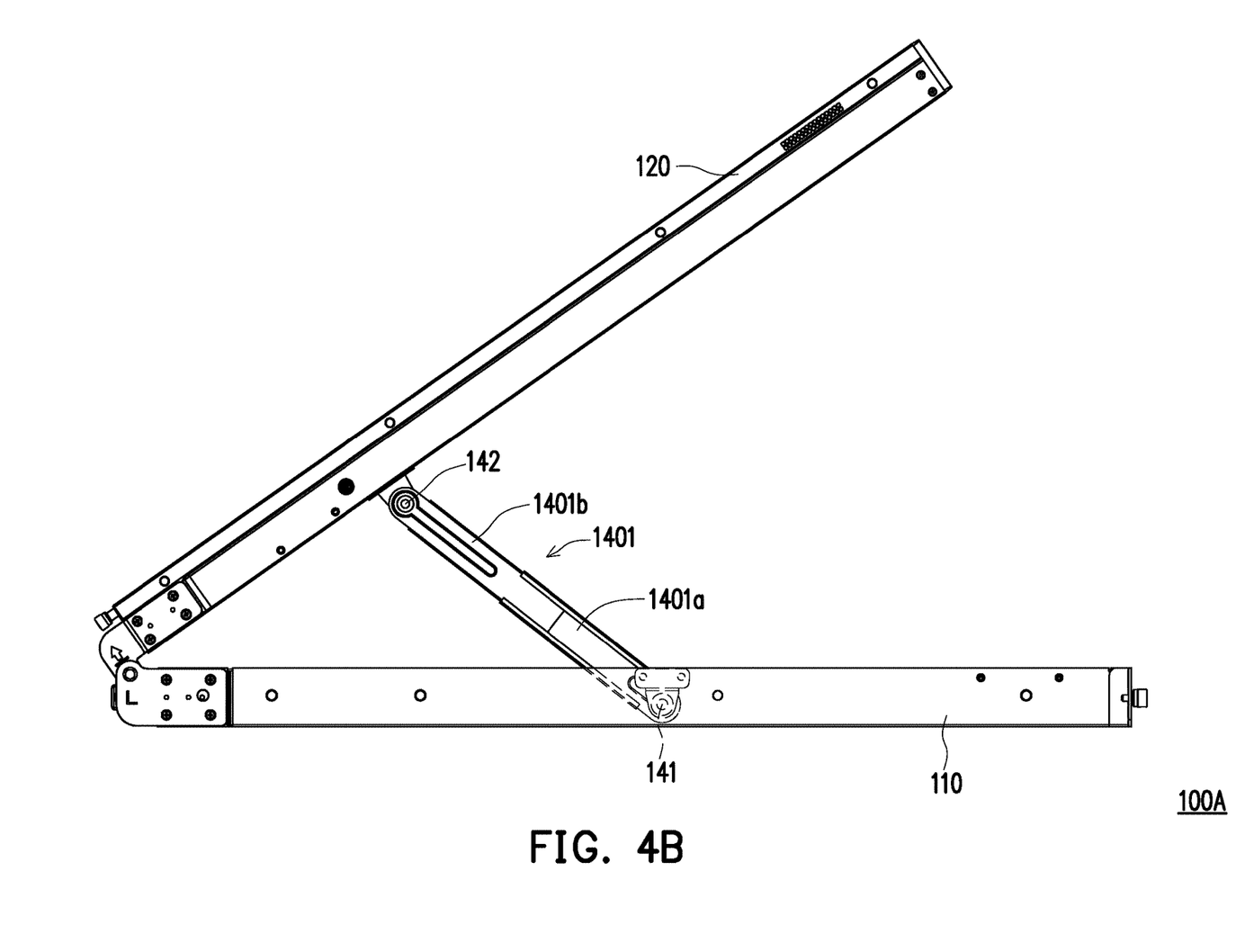

FIG. 4A and FIG. 4B are schematic diagrams of a server in two different states according to another embodiment of the disclosure. With reference to FIG. 4A and FIG. 4B, a layout of a server 100A of this embodiment is substantially similar to that of the server 100 of the abovementioned embodiment, except for a difference in a detailed configuration of the connecting element.

In the embodiment, a connecting element 1401 includes a first rod 1401a and a second rod 1401b slidably connected to the first rod 1401a, wherein the first connection end 141 is located on the first rod 1401a, and the second connection end 142 is located on the second rod 1401b. When the second server unit 120 is swiveled relative to the first server unit 110 and lifted relative to the first server unit 110, the second server unit 120 drives the second rod 1401b to move or slide relative to the first rod 1401a, and therefore drives the first rod 1401a to move or rotate relative to the first server unit 110.

Although the connecting elements 140 and 1401 of the abovementioned embodiment are, as in illustrating examples, described as two rods that are connected in a pivoting or a sliding manner respectively, in other embodiments, the connecting element may further include at least one rod between and connecting the first rod and the second rod.

Figure 5:
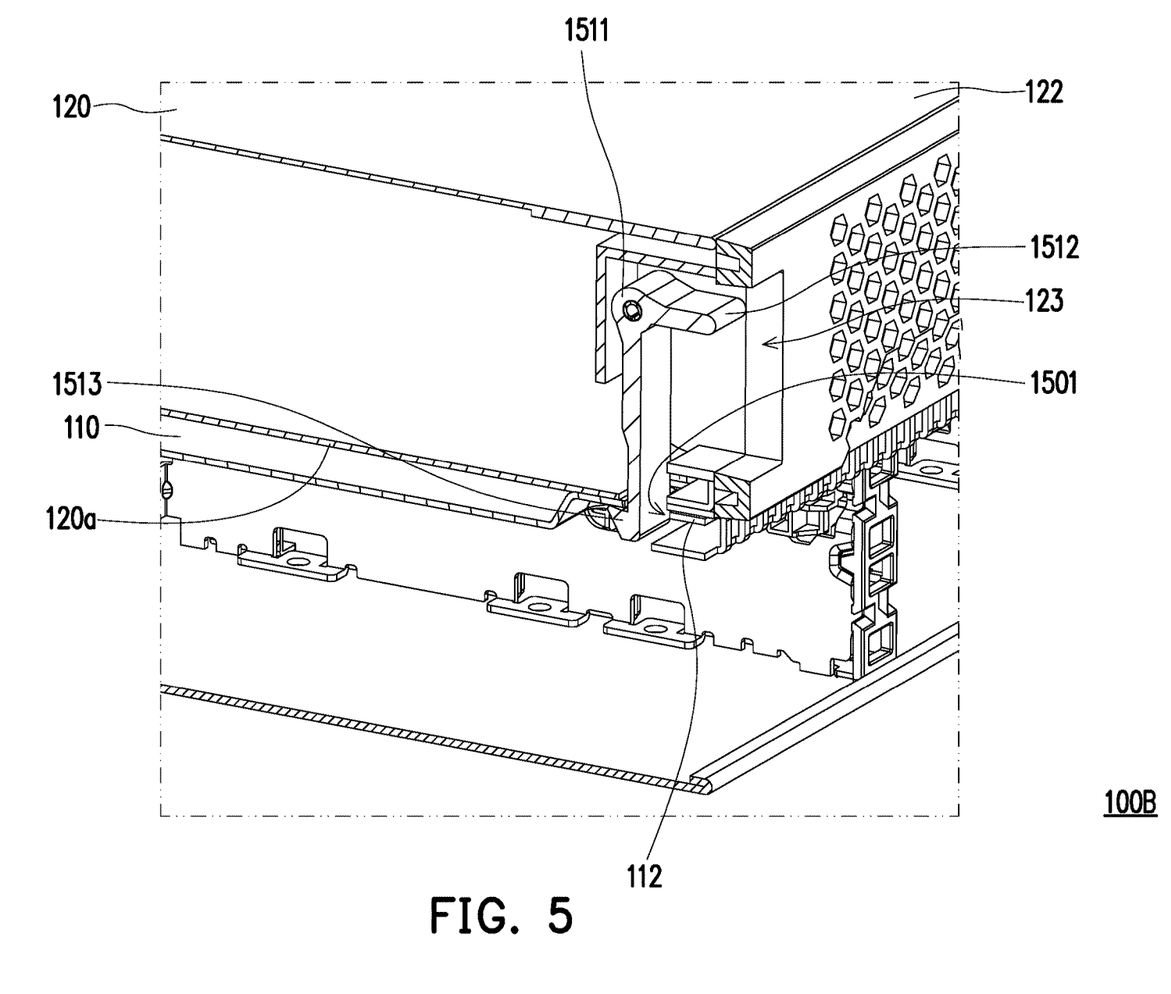
FIG. 5 is an enlarged schematic view of a partial cross-section of a server according to yet another embodiment of the disclosure.

FIG. 5 is an enlarged schematic view of a partial cross-section of a server according to yet another embodiment of the disclosure. With reference to FIG. 5, a layout of a server 100B of this embodiment is substantially similar to that of the server 100 of the abovementioned embodiment, except for a difference in fasteners of the two server units.

In the embodiment, a first fastener 1501 is disposed at the detachable end 112 of the first server unit 110 and faces the base 120a of the second server unit 120. For example, the first fastener 1501 is an engaging hole on the detachable end 112 of the first server unit 110. On the other hand, a second fastener 1511 is disposed at the detachable end 122 of the second server unit 120, wherein the second fastener 1511 is movably or pivotally disposed on the detachable end 122 of the second server unit 120, and the second fastener 1511 includes a handle 1512 and a hook 1513. Furthermore, the hook 1513 passes through the base 120a of the second server unit 120 and extends toward the first server unit 110. The handle 1512 is located in an opening 123 on the detachable end 122 of the second server unit 120 to make it convenient for the operator to operate.

When the hook 1513 of the second fastener 1511 is engaged with the engaging hole (i.e., the first fastener 1501), the second server unit 120 is folded on the first server unit 110, and the second server unit 120 cannot shift relative to the first server unit 110. The operator may apply force to the handle 1512 to drive the second fastener 1511 and release the engagement between the hook 1513 and the engaging hole (i.e., the first fastener 1501). After releasing the engagement between the hook 1513 and the engaging hole (i.e., the first fastener 1501), the operator may apply force to lift the second server unit 120.

In summary, a server system of the disclosure includes a server, and two server units of the server adopt a swivel design for unfolding and folding, thereby preventing the interior space of each server unit from being occupied, and improving the functional density. After a first server unit and a second server unit are unfolded, the connecting element can stably support the second server unit to prevent the second server unit from dropping. Therefore, the server and the server system of the disclosure not only have excellent scalability and operational reliability, but are also quite convenient for an operator to perform maintenance. Furthermore, the server may be slidably disposed on a rack of the server system, and therefore is quite convenient for the operator to take out and place the server.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A server, comprising:
   a first server unit, having a first casing and a first component disposed in the first casing;
   a second server unit, disposed on the first server unit and electrically connected to the first server unit, wherein the second server unit has a second casing and a second component disposed in the second casing, and a bottom surface of the second casing is a base facing a receding space of the first server unit;
   a hinge, wherein the second server unit is pivoted to the first server unit through the hinge; and
   a connecting element, disposed between the first server unit and the second server unit, wherein the connecting element has a first connection end connected to the first server unit and a second connection end connected to the second server unit,
   wherein a pivoting end and a detachable end are respectively disposed on a first short side of the server and a second short side of the server opposite to the first short side, and the connecting element connects the first server unit and the second server unit at a position corresponding to a long side between the first short side and the second short side.

2. The server according to claim 1, wherein each of the first server unit and the second server unit has a pivoting end and a detachable end, the pivoting end of the second server unit is connected to the pivoting end of the first server unit through the hinge, and the first connection end of the connecting element is located between the pivoting end and the detachable end of the first server unit, while the second connection end of the connecting element is located between the pivoting end and the detachable end of the second server unit.

3. The server according to claim 2, wherein a distance between the first connection end of the connecting element and the pivoting end of the first server unit is greater than or equal to a distance between the first connection end of the connecting element and the detachable end of the first server unit.

4. The server according to claim 2, further comprising:
   a first fastener, disposed at the detachable end of the first server unit; and
   a second fastener, disposed at the detachable end of the second server unit as corresponding to the first fastener.

5. The server according to claim 1, wherein the first connection end of the connecting element is located in the receding space, and the second connection end of the connecting element is connected to the base, and the receding space is configured to accommodate the connecting element.

6. The server according to claim 1, wherein the connecting element comprises a first rod and a second rod movably connected to the first rod, and the first connection end is located on the first rod and the second connection end is located on the second rod.

7. The server according to claim 1, wherein at least one of the first server unit and the second server unit has a receding space, the first connection end of the connecting element is connected to an inner sidewall of the first server unit, the second connection end of the connecting element is connected to an inner sidewall of the second server unit, and the receding space is configured to accommodate the connecting element.

8. The server according to claim 1, further comprising:
a slide rail disposed on an outer sidewall of the first server unit.

9. The server according to claim 1, wherein the connecting element is connected to the first server unit and the second server unit in close proximity to a first side surface of the first server unit and a second side surface of the second server unit, and the first side surface and the second side surface are adjacent to a pivoting end where the second server unit is pivoted to the first server unit.

10. The server according to claim 6, wherein the first rod is connected to the first server unit in close proximity to a first side surface of the first server unit, the second rod is connected to the second server unit in close proximity to a second side surface of the second server unit, and the first side surface and the second side surface are adjacent to a pivoting end where the second server unit is pivoted to the first server unit.

11. The server according to claim 1, wherein when the second server unit is lifted relative to the first server unit with an opening angle, the connecting element connected to the base supports the inclined second server unit.

12. The server according to claim 1, wherein the hinge is disposed on an exterior of the first server unit or the second server unit.

13. The server according to claim 1, wherein the second server unit is electrically connected to the first server unit at a position corresponding to the pivoting end of the server.

14. A server system, comprising:
a rack, having a storage space; and
at least one server, located in the storage space, wherein the at least one server comprises:
a first server unit, having a first casing and a first component disposed in the first casing;
a second server unit, disposed on the first server unit and electrically connected to the first server unit, wherein the second server unit has a second casing and a second component disposed in the second casing, and a bottom surface of the second casing is a base facing the first casing;
a connecting element, disposed between the first server unit and the second server unit at a position corresponding to a long side of the server, wherein the connecting element has a first connection end connected to the first server unit and a second connection end connected to the second server unit; and
a slide rail disposed between the first server unit and the rack,
wherein the second server unit is pivoted to the first server unit through a hinge at a position corresponding to a first short side of the server adjacent to the long side.

15. The server system according to claim 14, wherein each of the first server unit and the second server unit has a pivoting end and a detachable end, the pivoting end of the second server unit is pivoted to the pivoting end of the first server unit, the first connection end of the connecting element is located between the pivoting end and the detachable end of the first server unit, and the second connection end of the connecting element is located between the pivoting end and the detachable end of the second server unit.

16. The server system according to claim 15, wherein a distance between the first connection end of the connecting element and the hinge is greater than or equal to a distance between the first connection end of the connecting element and the detachable end of the first server unit.

17. The server system according to claim 15, wherein the at least one server further comprises:
a first fastener, disposed at the detachable end of the first server unit; and
a second fastener, disposed at the detachable end of the second server unit as corresponding to the first fastener,
wherein the first and second fasteners are disposed at a position corresponding to a second short side of the server opposite to the first short side.

18. The server system according to claim 14, wherein at least one of the first server unit and the second server unit has a receding space, and the receding space is configured to accommodate the connecting element.

19. The server system according to claim 14, wherein the connecting element comprises a first rod and a second rod movably connected to the first rod, the first rod is coupled to the first server unit through the first connection end, and the second rod is coupled to the second server unit through the second connection end.

20. The server system according to claim 14, wherein the connecting element is connected to the first server unit and the second server unit in close proximity to a first side surface of the first server unit and a second side surface of the second server unit, and the first side surface and the second side surface are adjacent to a pivoting end where the second server unit is pivoted to the first server unit.

21. The server system according to claim 19, wherein the first rod is connected to the first server unit in close proximity to a first side surface of the first server unit, the second rod is connected to the second server unit in close proximity to a second side surface of the second server unit, and the first side surface and the second side surface are adjacent to a pivoting end where the second server unit is pivoted to the first server unit.

* * * * *